(12) United States Patent
Nihei (10) Patent No.: US 7,960,277 B2
(45) Date of Patent: Jun. 14, 2011

(54) ELECTRONIC DEVICE AND METHOD OF MANUFACTURING THE SAME

(75) Inventor: Mizuhisa Nihei, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 434 days.

(21) Appl. No.: 12/059,745

(22) Filed: Mar. 31, 2008

(65) Prior Publication Data
US 2008/0237858 A1    Oct. 2, 2008

(30) Foreign Application Priority Data

Mar. 30, 2007 (JP) ................... 2007-095368

(51) Int. Cl.
*H01L 21/4763* (2006.01)

(52) U.S. Cl. ........ 438/637; 438/625; 438/645; 438/677; 257/E21.577; 257/E21.584; 257/E21.585; 977/742; 977/842

(58) Field of Classification Search .................. 438/625, 438/637, 645, 677; 257/746, E23.165
See application file for complete search history.

(56) References Cited

U.S. PATENT DOCUMENTS

| | | | |
|---|---|---|---|
| 7,094,679 B1 | 8/2006 | Li et al. | |
| 2004/0152240 A1* | 8/2004 | Dangelo | 438/122 |
| 2005/0164494 A1* | 7/2005 | Nakagawa et al. | 438/637 |
| 2006/0091557 A1 | 5/2006 | Sakamoto et al. | |
| 2006/0292861 A1* | 12/2006 | Furukawa et al. | 438/627 |
| 2007/0096616 A1* | 5/2007 | Han et al. | 313/309 |
| 2007/0148963 A1* | 6/2007 | Chan et al. | 438/637 |
| 2007/0205450 A1* | 9/2007 | Okita | 257/296 |
| 2008/0003733 A1* | 1/2008 | Kim et al. | 438/197 |

FOREIGN PATENT DOCUMENTS

| | | |
|---|---|---|
| JP | 2006-120730 A | 5/2006 |
| JP | 2006-202942 A | 8/2006 |
| WO | WO 2004/068545 A2 | 8/2004 |
| WO | WO 2005/076381 A1 | 8/2005 |
| WO | WO 2006/043329 A1 | 4/2006 |

OTHER PUBLICATIONS

European Search Report dated Aug. 4, 2008, issued in corresponding European Patent Application No. 08153473.7.

Nihei, M. et al; "Low-resistance multi-walled carbon nanotube vias with parallel channel conduction of inner shells [IC interconnect applications]"; Interconnect Technology Conference, 2005. Proceedings of the IEEE 2005 International, p. 234, Aug. 29, 2005.

Sato, S. et al.; "Novel approach to fabricating carbon nanotube via interconnects using size-controlled catalyst nanoparticles"; Interconnect Technology Conference, 2006. International, p. 230, Jul. 5, 2006.

Hoenlein, W.; "New Prospects for Microelectronics: Carbon Nanotubes"; JPN. J. Appl. Phys., vol. 41, 2002.

* cited by examiner

*Primary Examiner* — Angel Roman
(74) *Attorney, Agent, or Firm* — Westerman, Hattori, Daniels & Adrian, LLP (57) ABSTRACT

An electronic device includes a conductive pattern formed on a first insulating film, a second insulating film formed on the conductive pattern and the first insulating film, a hole formed in the second insulating film on the conductive pattern, carbon nanotubes formed in the hole to extend from a surface of the conductive pattern, and a buried film buried in clearances among the carbon nanotubes in the hole.

9 Claims, 9 Drawing Sheets

ELECTRONIC DEVICE AND METHOD OF MANUFACTURING THE SAME

CROSS-RELATED APPLICATION

This application claims priority to Japanese Patent Application 2007-095368, filed Mar. 30, 2007, and is fully incorporated herein by reference.

FIELD OF THE INVENTION

The present invention relates to an electronic device and a method of manufacturing the same and, more particularly, an electronic device equipped with an interconnection structure using carbon nanotubes and a method of manufacturing the same.

BACKGROUND OF THE INVENTION

The demand for electronic devices is led by the products in the multimedia field, such as a mobile terminal, a game machine, and the like, and has steadily increased. The copper (Cu) damascene interconnect structure is used in such electronic devices, e.g., a part of Large-Scale Integration (LSI). The copper interconnection has a lower resistance and a higher current density than an aluminum interconnection.

In order to accommodate a need for a higher integration of LSI, it is required to provide an interconnection structure which has thinner line-widths and higher withstand current densities.

As one of approaches to improve the interconnection structure, the carbon nanotube (CNT) which has a carbon cylindrical structure with a lower resistance and a higher withstand current density has got some attention.

Because of the one-dimensional electronic characteristic due to the shape anisotropy, the electrons flow through the carbon nanotube by a ballistic conduction, and a maximum current density is approximately in the order of $10^9$ A/cm$^2$. The carbon nanotube is excellent in the electromigration resistance to such an extent that it can flow thousand times the current of Cu per unit area.

Japanese Patent Application Publication Nos. 2006-120730-A and 2006-202942-A, IEEE International Interconnect Technology Conference 2006, p. 230, IEEE International Interconnect Technology Conference 2005, p. 234, and Jan. J. Appl. Phys. Vol. 41 (2002) pp. 4370-4374, for example, disclose that the CNT is used as interconnection structure in the LSI.

Japanese Patent Application Publication No. 2006-120730, and IEEE International Interconnect Technology Conference 2006, p. 230 disclose that a bundle of carbon nanotubes extended vertically from a bottom surface of a hole in an insulating film is used as via interconnection.

Figure 4A:
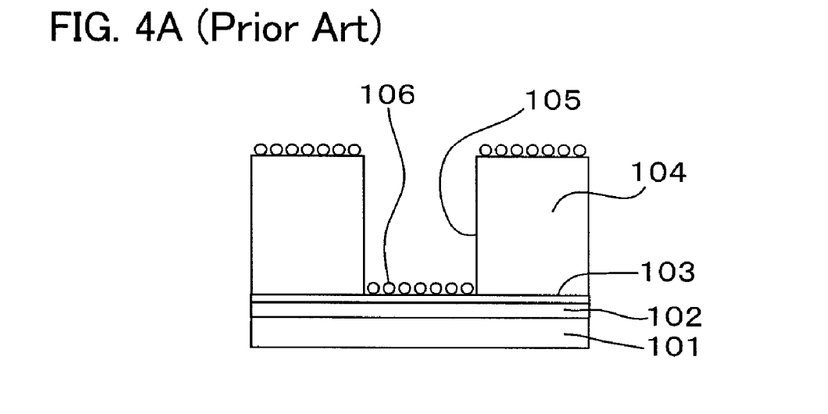
FIGS. 4A to 4C are sectional views showing conventional steps of forming an interconnection structure of an electronic device in the prior art.
Figure 4B:
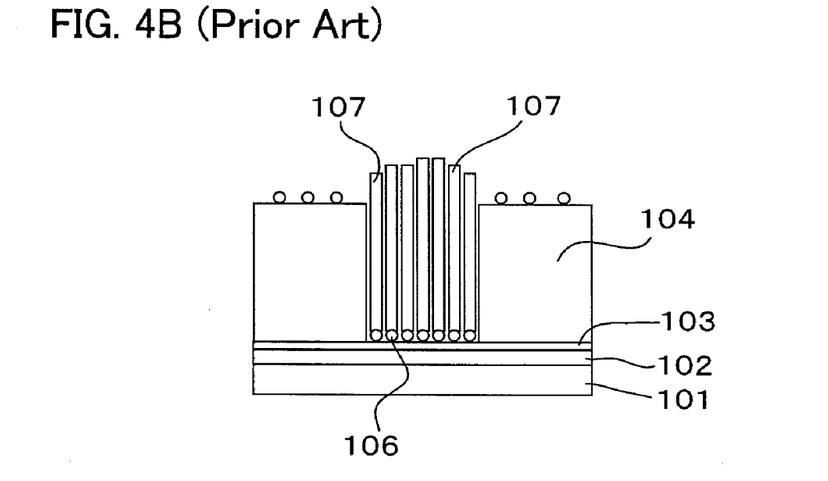
Figure 4C:
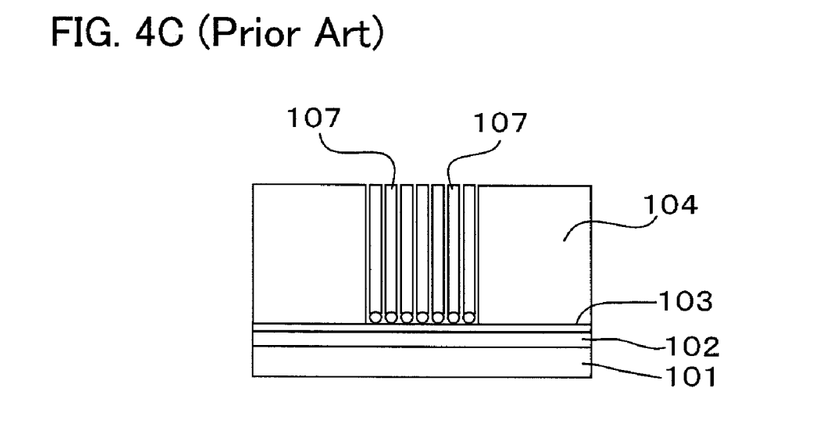

FIGS. 4A to 4C show conventional steps of forming a via made of carbon nanotubes.

First, as shown in FIG. 4A, a tantalum (Ta) film 102 is formed on a copper film 101 as a copper diffusion barrier, and then a film, e.g., a titanium nitride (TiN) film 103, which sets a growth direction of the carbon nanotubes is formed thereon.

Then, a silicon oxide film 104 is formed on the TiN film 103, and then a via hole 105 is formed by patterning the silicon oxide film 104 by means of the photolithography method, or the like. Then, cobalt (Co) catalyst particles 106 are formed on a surface of the TiN film 103 through the via hole 105 to distribute uniformly in the surface.

Then, as shown in FIG. 4B, carbon nanotubes 107 are formed upwardly from the Co catalyst particles 106 in the via hole 105 in predetermined condition.

Then, as shown in FIG. 4C, portions of the carbon nanotubes 107 protruding from an upper surface of the silicon oxide film 104 are removed. Thus, the carbon nanotubes 107 left in the via hole 105 are used as the via.

A diameter of the carbon nanotube 107 is almost in a range of subnano to several tens nm, and a length of the carbon nanotube can be grown up to several hundreds μm.

SUMMARY OF THE INVENTION

According to an aspect of an embodiment, there is provided a method of manufacturing an electronic device, which includes the steps of forming a conductive pattern over a first insulating film on a substrate, forming a second insulating film to cover the first insulating film and the conductive pattern, forming a hole in the second insulating film over the conductive pattern, forming a catalyst-supported film over a bottom surface of the hole and an upper surface of the second insulating film, forming a catalyst surface made of at least one of catalyst particle and a catalyst film over a surface of the catalyst-supported film, growing element cylindrical structures on the catalyst surface, forming a buried film in clearance among the carbon element cylindrical structures, and polishing the carbon element cylindrical structures, the buried film, and the catalyst-supported film to remove the carbon element cylindrical structure, the buried film, and the catalyst-supported film over an upper surface of the second insulating film and to leave the buried film and of the carbon element cylindrical structures in the hole as a via.

Also, according to another aspect of an embodiment invention, there is provided an electronic device, which includes a conductive pattern formed over a first insulating film formed over a substrate, a second insulating film for covering the conductive pattern and the first insulating film, a hole formed in the second insulating film over the conductive pattern, carbon element cylindrical structures formed in the hole to extend from a surface of the conductive pattern to an upper end of the hole, and a buried film buried in a clearance among the carbon element cylindrical structures in the hole.

BRIEF DESCRIPTION OF THE DRAWINGS

The invention will be described in connection with non-limiting embodiments with reference to the accompanying drawings.

DESCRIPTION OF THE PREFERRED EMBODIMENTS

Embodiments of the present invention will be explained in detail with reference to the drawings as follows. In the following description, for purposes of explanation, specific nomenclature is set forth to provide a thorough understanding of the various inventive concepts disclosed herein. However, it will be apparent to those skilled in the art that these specific details may not be required in order to practice the various inventive concepts disclosed herein.

It is an object of the present invention to provide an electronic device having via formed of a carbon element cylindrical structure as a good structure and a method of manufacturing the same.

According to the method of manufacturing an electronic device of the present embodiment, carbon element cylindrical structures are formed on an inside of the hole in an insulating film and on an upper surface of the insulating film, then a buried film is filled in clearances among carbon element cylindrical structures, and then the carbon element cylindrical structures and the buried film are removed from an upper surface of the insulating film. Thus, the carbon element cylindrical structures and the buried film are left in the hole as the via.

According to the formation of the via, it will expand the range of choices for a condition for forming the carbon element cylindrical structures and a process margin for forming catalyst particles or a catalyst film under the carbon element cylindrical structures, thus a yield of via formation is improved.

Also, according to the electronic device of the present invention, a buried film made of an insulating material or a conductive material is filled in clearances among carbon element cylindrical structures constituting via that is formed in an insulating film. Therefore, the buried film can prevent gas or material deteriorating the carbon element cylindrical structures from coming into the clearances among the carbon element cylindrical structures, and thus the stable via structure can be formed.

According to the conventional method as shown in FIGS. 4A to 4C, the Co catalyst particles 106 acting as the growth nucleus of the carbon nanotubes 107 are formed selectively and distributed uniformly on the TiN film 103 in the via hole 105. But a process margin of the optimum condition is narrow.

As a result, it is difficult to form the via made of the carbon nanotubes 107 with high controllability and high yield.

An embodiment of the present invention will be described in detail with reference to the drawings below.

First Embodiment

FIGS. 1A to 1H are sectional views showing an electronic device according to a first embodiment of the present invention and steps of manufacturing the same.

Figure 1A:
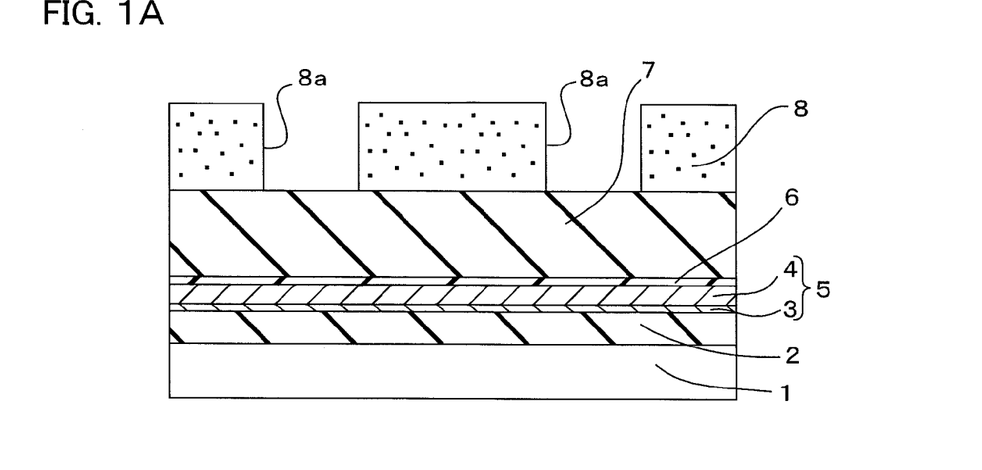
FIGS. 1A to 1H are sectional views showing an electronic device according to a first embodiment of the present invention and steps of manufacturing the same.

First, steps to form a structure shown in FIG. 1A will be explained below.

Then, a first interlayer insulating film 2 made of a silicon oxide film is formed on a silicon substrate 1 by the chemical vapor deposition (CVD) method. Then, a tantalum (Ta) film 3 and a copper (Cu) film 4 are formed sequentially thereon by the sputter. A transistor is formed in the silicon substrate 1, and the transistor is covered with the first interlayer insulating film 2.

As the first interlayer insulating film 2, a silicon oxide film is formed by the CVD method using a silane gas or a tetraethoxysilane (TEOS) gas, for example.

Then, the Cu film 4 and the Ta film 3 are patterned into a wiring profile by the photolithography method using the photoresist. Thus, a first-layer wiring 5 is formed to the conductive pattern. A line width of the wiring 5 is set to several hundreds nm or less, e.g., about 200 nm, for example.

Then, a silicon nitride film 6 is formed on the wiring 5 and the first interlayer insulating film 2 to have a thickness of 50 nm to 100 nm, for example. The silicon nitride film 6 is formed as a copper diffusional inhibition and antioxidant film.

Then, a second interlayer insulating film 7 is formed on the silicon nitride film 6 to have a thickness of about 200 nm, for example. As the second interlayer insulating film 7, a silicon oxide film is formed by the plasma CVD method using a TEOS gas as a reaction gas, for example.

Then, a photoresist 8 is coated on the second interlayer insulating film 7, and then exposed/developed. Thus, opening portions 8a are formed in via-forming regions.

Then, via holes 7a are formed by etching the second interlayer insulating film 7 while using the photoresist 8 as a mask. Either of the dry etching such as the reactive ion etching method, the plasma etching method, or the like or the wet etching method using a hydrofluoric acid may be adopted as the etching method of the second interlayer insulating film 7 made of the silicon oxide film.

Figure 1B:
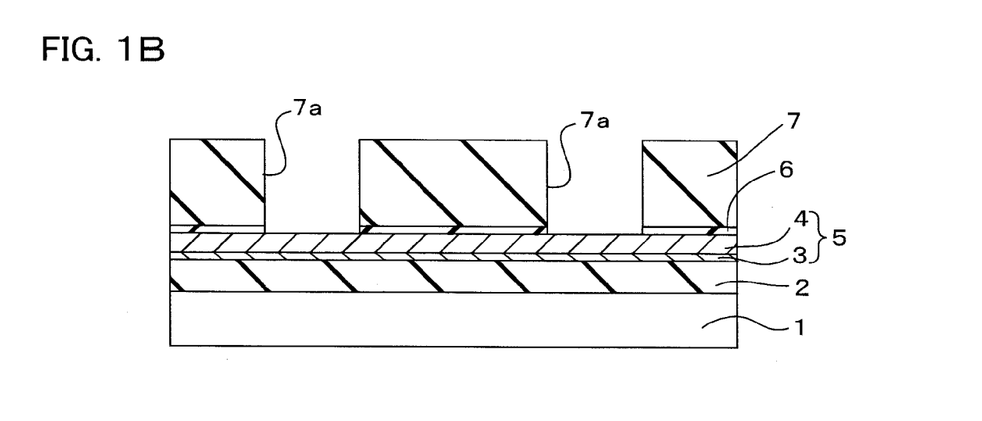

After removing the photoresist 8, the silicon nitride film 6 is etched through the via holes 7a by a phosphoric acid, or the like, as shown in FIG. 1B. Thus, a part of the wiring 5 is exposed through the via holes 7a.

Figure 1C:
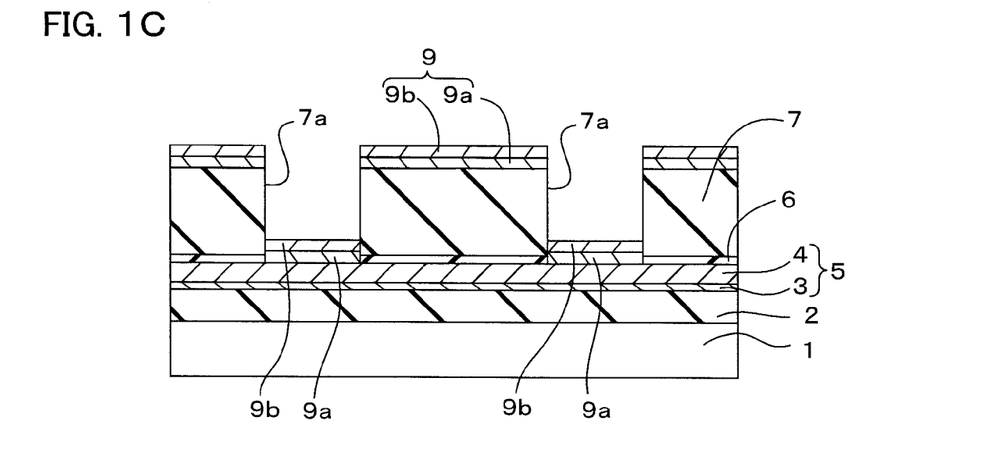

Then, as shown in FIG. 1C, a metal film 9 as a catalyst-supported film is formed on an upper surface of the second interlayer insulating film 7 and bottom surfaces of the via holes 7a by the film forming method, which has a high degree of growth anisotropy to the perpendicular direction on an upper surface of the silicon substrate 1, respectively.

The metal film 9 is formed by the method that hardly makes a metal adhere to inner side walls of the via holes 7a, like an anisotropic long-throw sputtering method that supplies constitutive element particles while setting a distance between a target and a sample longer than a diameter of a target. As such method for forming film, that gives a high straight traveling property to the metal element, there are the collimator sputter, the ionization metal plasma (IMP) sputter, and the like, in addition to the anisotropic long-throw sputtering method.

The metal film 9 is formed of a two-layered structure consisting of an lower metal film 9a and an upper metal film 9b in FIG. 1C. In this case, the metal film 9 may be formed of a single layer or plural layers that are made of any one of tantalum, tantalum nitride (TaN), titanium (Ti), and titanium nitride (TiN), or their combination.

The lower metal film 9a is made of Ta or TaN, which acts as a Cu diffusion barrier film. Also, the upper metal film 9b is made of Ti or TiN, which can be satisfactorily electrically or mechanically connected to the via, described later.

When the TiN film is formed as the upper metal film 9b by the reactive sputter, for example, a Ti target is used and also nitrogen and argon are introduced in the sputter atmosphere.

Figure 1D:
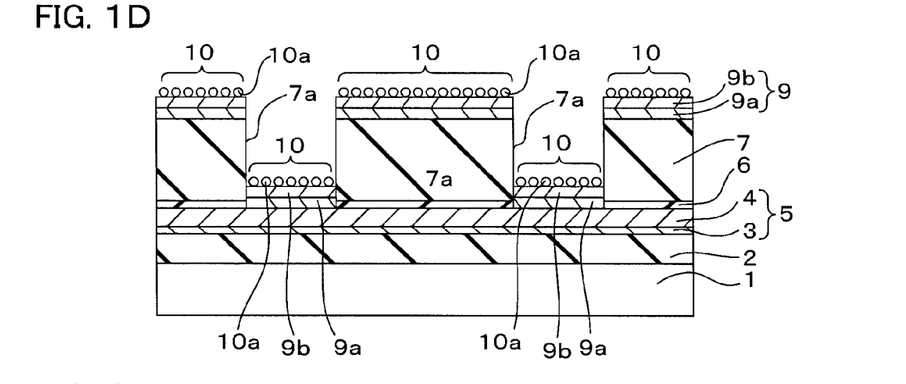

Then, as shown in FIG. 1D, catalyst surfaces 10 as catalyst areas made of catalyst metal fine particles 10a or a catalyst film (not shown) of about 1 nm thickness are formed on a surface of the metal film 9, i.e., on the metal film 9 on the bottom portions of the via holes 7a and the metal film 9 on the upper surface of the second interlayer insulating film 7.

Cobalt, iron (Fe), nickel (Ni), or a binary metal alloy containing either of them, for example, TiCo, or alloy containing either of them may be used as the metal element constituting the catalyst metal fine particle on the catalyst surface or the catalyst film.

The catalyst metal fine particles 10a or the catalyst film is formed by the laser ablation method, the sputtering method, the vapor deposition method, or the like, for example. In these methods, it is desirable to enhance anisotropy of the catalyst element growth in the vertical direction of the metal film 9 by employing an approach that forms the catalyst metal fine particles 10a or the catalyst film on a surface of the metal film 9 using a differential pumping mechanism in a vacuum chamber.

Figure 1E:
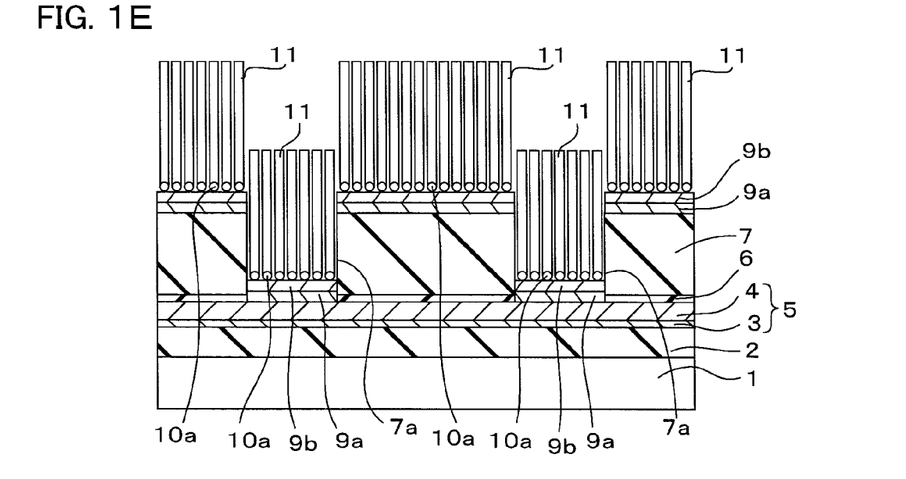

Then, as shown in FIG. 1E, a bundle of carbon nanotubes 11, the carbon element cylindrical structure, is grown on the whole area of catalyst surfaces 10 by the CVD method. As the CVD method, for example, there are the thermal CVD method, the thermal filament CVD method, and the plasma CVD method. When the catalyst surface 10 is formed of the catalyst metal fine particles 10a, the carbon nanotubes 11 are oriented in the vertical direction of the substrate surface and grown from the catalyst metal fine particles 10a.

When the thermal CVD method is used as the CVD method, a mixed gas of acetylene and argon, for example, as a reaction gas is introduced into a growth atmosphere of a vacuum chamber.

The acetylene is diluted with argon at 10 flow rate % and introduced into the vacuum chamber. Also, flow rates of acetylene containing gas and argon gas are set to 0.5 sccm and 1000 sccm, for example, respectively. Also, as other growth conditions, a pressure in the vacuum chamber is set to 1 kPa and a substrate temperature is set to 400° C. to 450° C.

A growth rate of the carbon nanotubes 11 in such conditions is about 1 μm/hour, for example.

When the thermal filament CVD method is employed as the method of growing the carbon nanotubes 11, a temperature of the thermal filament used to dissociate a gas is set in a range of 900° C. to 1800° C., for example.

Meanwhile, when the TiN film is formed by the sputter as the upper metal film 9b on which the catalyst surface 10 is formed, a ratio ($P_1/P_2$) of a pressure ($P_1$) of a nitrogen gas to a pressure ($P_2$) of an argon gas in the sputter atmosphere is set in a range 3/100 to 30/100, preferably a range 5/100 to 15/100.

Accordingly, a growth density of the carbon nanotubes 11 can be improved. This may be attributed to the fact a surface roughness of the TiN film, which becomes relatively large in this condition, inhibits movement of the carbon in the lateral direction, and thus a growth of the carbon nanotubes 11 is accelerated in the length direction.

Figure 1F:
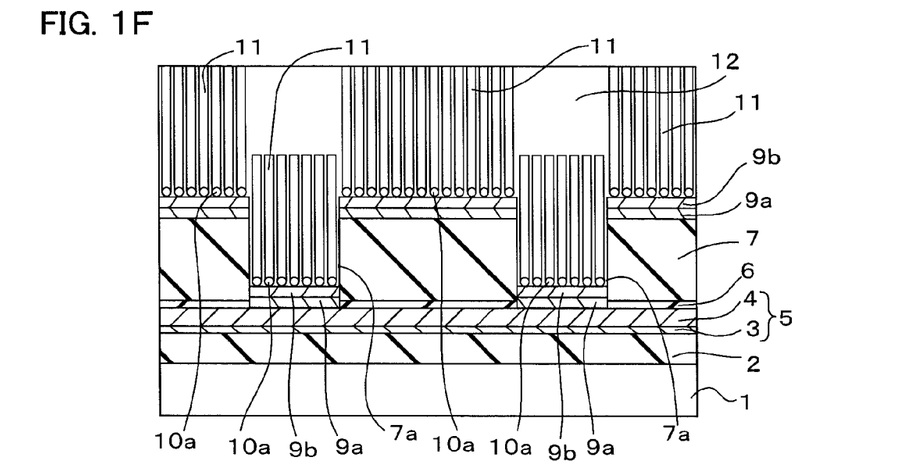

Then, as shown in FIG. 1F, a buried insulating film 12 is formed in clearances among plural of the carbon nanotubes 11 that are grown in the via holes 7a and on the second interlayer insulating film 7 respectively.

The buried insulating film 12 is formed by using an SOG (Spin-On-Glass) as the coating insulating substance, for example. The SOG is formed on the catalyst surfaces 10 by the spin coating method, then baked by the heating at a temperature of 250° C. for 5 minute, for example, and then cured by the heating at a temperature of 400° C. for 30 minute, for example.

In this case, as the pretreatment of the SOG coating, the oxygen plasma treating, the ozone treating, or the ultraviolet rays (UV) irradiation may be applied to the coating areas, for improving wettability in the SOG coating in the via holes 7a, on the second interlayer insulating film 7, and in the clearances among the carbon nanotubes 11.

The porous material, the SOG, which is formed by the curing, includes few defects such as cracks, or the like. For this reason, it is desirable to use the material for the buried insulating film 12. An organic SOG or an inorganic SOG may be employed as the SOG. The organic SOG has good wettability.

The buried insulating film 12 may be formed by the plasma CVD method using a silane system gas, TEOS, or the like.

However, it is more desirable to adopt the coating method, because the coating material is suitable for filling the clearance among the carbon nanotubes 11.

Also, it is preferable that the buried insulating film 12 should be formed of a low dielectric constant material from an aspect of electrical conductivity.

Figure 1G:
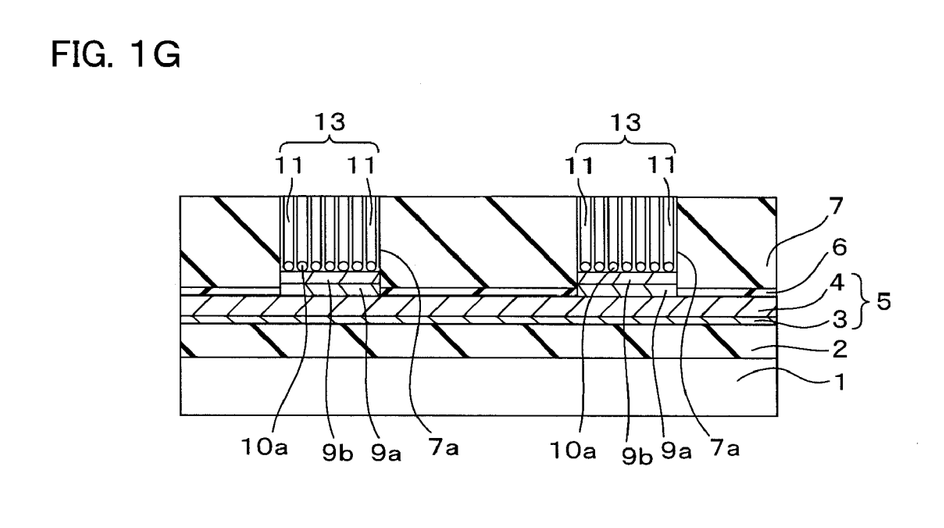

Then, as shown in FIG. 1G, the carbon nanotubes 11 and the buried insulating film 12 are polished by the chemical mechanical polishing (CMP) method. Thus, upper portions of the carbon nanotubes 11 and the buried insulating film 12 are planarized, and also the carbon nanotubes 11, the buried insulating film 12, and the metal film 9 are removed from the upper surface of the second interlayer insulating film 7.

As a result, the carbon nanotubes 11 are left selectively in the via holes 7a as a via 13.

As an abrasive used in the CMP method, for example, the alkaline slurry is used. In the CMP method, preferably a polishing rate of the silicon oxide ($SiO_2$) constituting the buried insulating film 12 should be set as highly a selective polishing condition which is larger than a polishing rate of the tantalum (Ta) constituting the metal film 9.

A polishing rate of the carbon nanotubes 11 is decreased correspondingly as the quality is improved highly. At that time, a polishing rate of the carbon nanotubes 11 can be increased by changing the alkaline slurry into the acid slurry.

In this case, a polishing rate of the $SiO_2$ is decreased by employing the acid slurry. Therefore, the polishing is continued while adjusting PH of the slurry to flatten the upper ends of the carbon nanotubes 11 and the upper surface of the second interlayer insulating film 7.

The polishing conditions of the CMP method are changed at a point of time when the metal film 9 is exposed by polishing the carbon nanotubes 11 and the buried insulating film 12. In this case, it is desired the highly selective polishing in which a polishing rate of the metal film 9 is set larger than respective polishing rates of the buried insulating film 12 and the second interlayer insulating film 7. The acid slurry for the titanium (Ta) is used as the condition.

Accordingly, the polishing of the second interlayer insulating film 7 made of the silicon oxide film is suppressed while the lower metal film 9a is being polished. Thus, the metal film 9 is selectively removed.

The vias 13 are formed through the polishing described above. Then, a polishing residue on the surface of the second interlayer insulating film 7 is removed by a 5% dilute hydrofluoric acid, for example. Also, an exposed level of the carbon nanotubes 11, i.e., the vias 13 from the upper end of the via hole 7a is increased by etching the exposed surface of the buried insulating film 12.

Figure 1H:
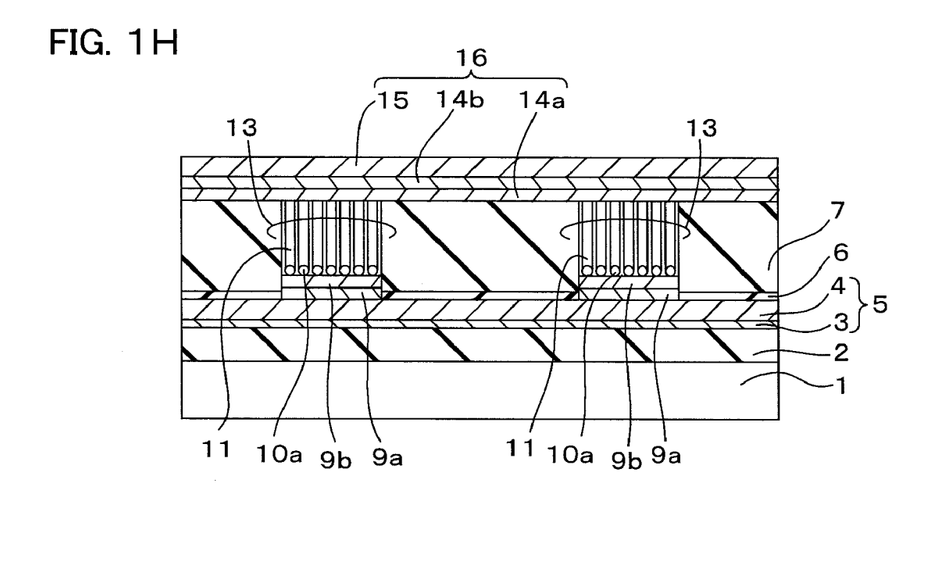

Then, as shown in FIG. 1H, a contact film 14a made of TiN, Ti, or their composite film is formed on the second interlayer insulating film 7 and the vias 13 by the sputter method. Then, a Cu diffusion preventing film 14b made of Ta, TaN, or their composite film is formed by the sputter. Then, a Cu film 15 is formed on the Cu diffusion preventing film 14b by the electroplating.

Then, an electrical joinability between the carbon nanotubes 11 and the contact film 14a is improved by heating the silicon substrate 1 at about 400° C.

Then, the Cu film 15, the Cu diffusion preventing film 14b, and the contact film 14a are patterned by the photolithography method. Thus, a second-layer wiring 16, a conductive pattern, is formed overlapping the vias 13.

Then, although not particularly shown in figure, a silicon nitride film for preventing Cu diffusion, a third interlayer insulating film, and the like are formed on the second-layer wiring 16 and the second interlayer insulating film 7.

According to the above process, a multi-layered interconnection structure is formed of the first-layer wiring 5 and the second-layer wiring 16 connected mutually through the vias 13 including the bundle of the carbon nanotubes 11 in an electronic device.

As described above, in the present embodiment, the catalyst surface 10 is positively formed not only in the via holes 7a but also on the surface of the second interlayer insulating film 7, and then the carbon nanotubes 11 are grown thereon. Therefore, the condition for forming the catalyst surface 10 are relaxed rather than the case where the catalyst particles and the catalyst film are formed selectively in the via holes 7a. As a result, a yield of the vias 13 formed of the bundle of the carbon nanotubes 11 can be improved rather than the prior art.

Also, in polishing the carbon nanotubes 11 protruded from the upper surface of the second interlayer insulating film 7, the clearances among the carbon nanotubes 11 are filled with the buried insulating film 12. Therefore, a large number of carbon nanotubes 11 are fixed by the buried insulating film 12, thus it is easy to remove and planarize the carbon nanotubes 11 by the polishing.

Further, the clearances among the carbon nanotubes 11, the via 13, in the via holes 7a are buried with the buried insulating film 12. Therefore, the buried insulating film 12 may prevent gas and foreign matter for deteriorating the carbon nanotubes 11 from entering into the clearances.

In addition, the metal film 9 having a higher resistance than the carbon nanotubes 11 is not formed on the inner wall surface of the via hole 7a in which the via 13 is buried. Therefore, the via 13 made of the carbon nanotubes 11 only as conductor only in via hole 7a has a lower resistance and a larger current capacity.

Second Embodiment

FIGS. 2A to 2I are sectional views showing an electronic device according to a second embodiment of the present invention and steps of manufacturing the same. Here, in FIGS. 2A to 2I, the same reference symbols as those in FIGS. 1A to 1H denote the same elements respectively.

First, steps of forming a structure shown in FIG. 2A will be explained below.

Like the first embodiment, the first interlayer insulating film 2 made of the silicon oxide film is formed on the silicon substrate 1 by the CVD method. A transistor (not shown) is formed on the silicon substrate 1, and the transistor is covered with the first interlayer insulating film 2.

A first underlaying insulating film 22 made of silicon nitride and a second interlayer insulating film 23 made of the material of a low dielectric constant are formed on the first interlayer insulating film 2. The second interlayer insulating film 23 is formed by coating a coating solution containing an organic silicon compound or a porous silica on the first underlaying insulating film 22, then evaporating a solvent in the coating solution, and then annealing the resultant structure in a nitrogen atmosphere, for example.

Then, wiring recesses 23a whose width is about 200 nm are formed by patterning the second interlayer insulating film 23 by means of the photolithography method. In forming the wiring recesses 23a, the second interlayer insulating film 23 is etched by a fluorine gas and the first underlaying insulating film 22 serves as an etching stopper.

Then, the first underlaying insulating film 22 exposed from the wiring recesses 23a is etched selectively by a phosphoric acid to further deepen the wiring recesses 23a. Thus, a depth of the wiring recess 23a is controlled with good precision.

Then, the etching residue on a surface of the second interlayer insulating film 23 is removed by the wet process, and then the surface of the second interlayer insulating film 23 is cleaned.

Then, a Ta film or a TaN film is formed as a Cu diffusion preventing film 25a on the second interlayer insulating film 23 and inner surfaces of the wiring recesses 23a by the sputter. Then, a Cu film 25b is formed on the Cu diffusion preventing film 25a by the electrolating and is buried in the wiring recesses 23a.

Then, the Cu diffusion preventing film 25a and the Cu film 25b formed on the upper surface of the second interlayer insulating film 23 are removed by the CMP method. Accordingly, the Cu film 25b and the Cu diffusion preventing film 25a left in the wiring recesses 23a are used as a first-layer wiring 25 of a damascene structure.

Then, a silicon nitride film 26 is formed on the first-layer wiring 25 and the second interlayer insulating film 23 by the CVD method to have a thickness of 50 nm to 100 nm, for example. The silicon nitride film 26 prevents an oxidation of the first-layer wiring 25 and also prevents a diffusion of copper.

Then, a third interlayer insulating film 27 made of the material having a low dielectric constant is formed on the silicon nitride film 26 to have a thickness of 200 nm, for example. As the material having a low dielectric constant, the insulating material containing the same silicon as that constituting the second interlayer insulating film 23 is used.

That is, the third interlayer insulating film 27 is formed by coating the coating solution containing the organic silicon compound or the porous silica on the silicon nitride film 26, then evaporating the solvent in the coating solution, and then annealing the resultant structure in the nitrogen atmosphere, for example.

Then, a photoresist 28 is coated on the third interlayer insulating film 27, and then exposed/developed. Thus, opening portions 28a are formed in via forming regions.

Figure 2A:
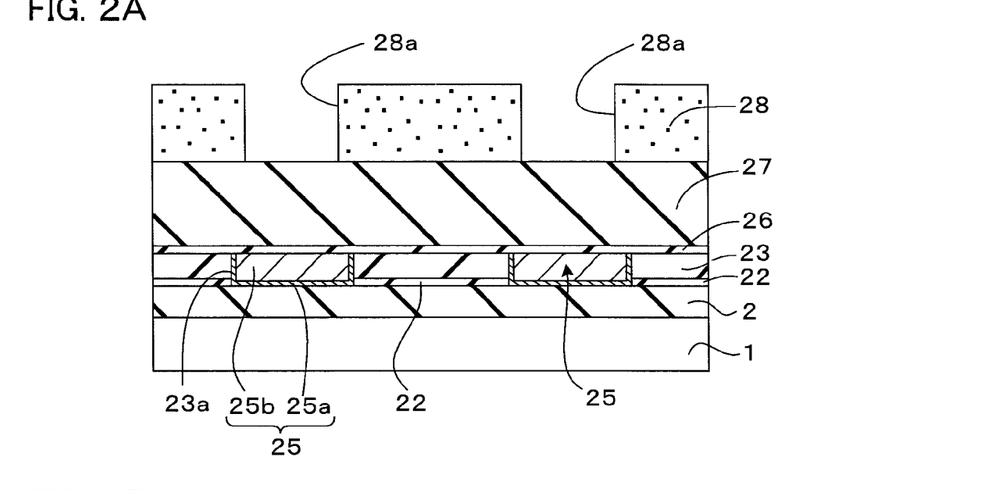
FIGS. 2A to 2I are sectional views showing an electronic device according to a second embodiment of the present invention and steps of manufacturing the same.
Figure 2B:
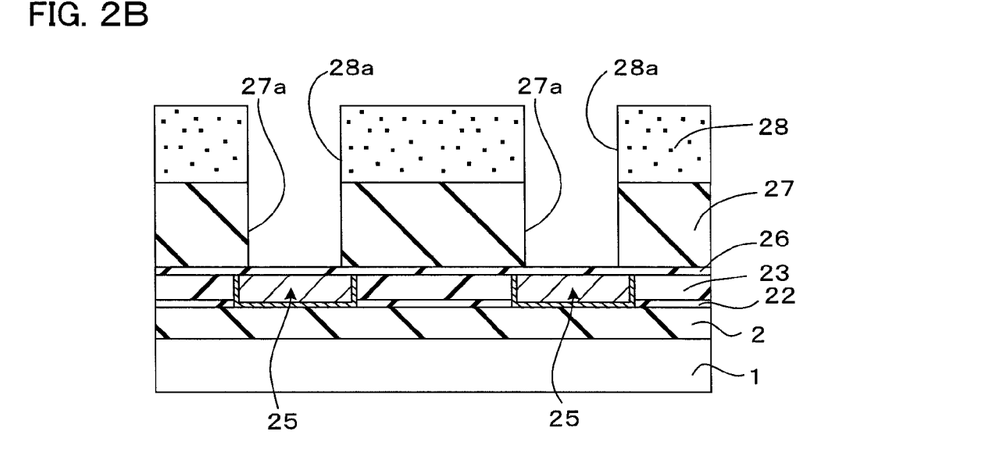

Then, as shown in FIG. 2B, via holes 27a are formed by etching the third interlayer insulating film 27 while using the photoresist 28 as a mask. The dry etching such as the reactive ion etching method using a fluorine gas, the plasma etching method, or the like is used as the etching of the third interlayer insulating film 27. Then, the photoresist 28 is removed.

In this case, an etching residue exits on the surface of the third interlayer insulating film 27 exposed after removing the photoresist 28. Therefore, the etching residue is removed by the wet process.

Figure 2C:
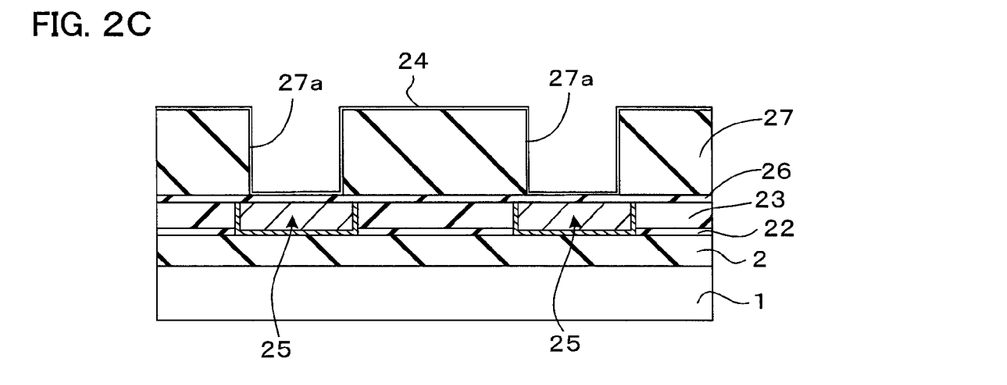

Meanwhile, when the third interlayer insulating film 27 made of the material having a low dielectric constant is of the porous type, a pore sealing layer 24 is formed on the upper surface of the third interlayer insulating film 27 and inner side surfaces and bottom surfaces of the via holes 27a, as shown in FIG. 2C, after the photoresist 28 is removed. As the pore sealing layer 24, for example, SiOC is formed by the CVD method. The pore sealing layer 24 permeates through the upper surface of the third interlayer insulating film 27 and the inner wall surfaces of the via holes 27a respectively. In this case, the pore sealing layer 24 is omitted from FIG. 2D and thereafter.

Then, the silicon nitride film 26 and the pore sealing layer 24 on the bottom portion are etched through the via holes 27a by the sputter, for example. Thus, a part of the copper layer 25 is exposed from the via holes 27a. In this etching, the pore sealing layer 24 on the upper surface of the third interlayer insulating film 27 is covered and protected with a photoresist (not shown).

Figure 2D:
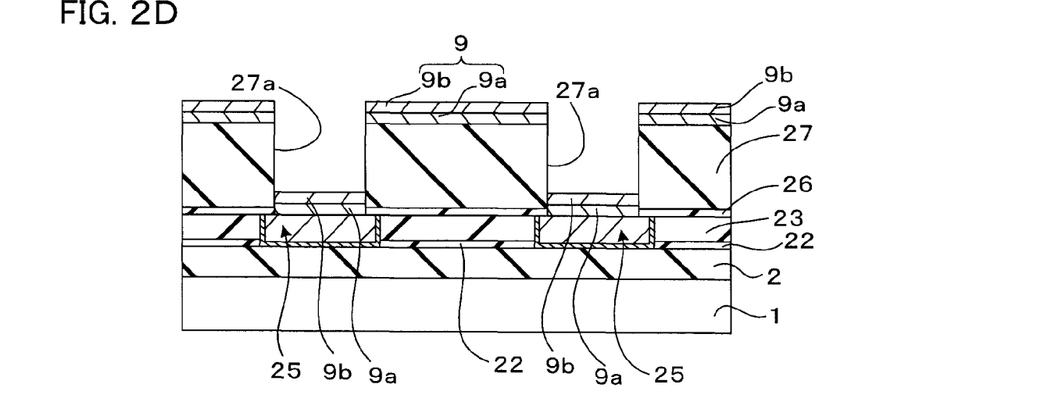

Then, as shown in FIG. 2D, the metal film 9 is formed on the upper surface of the third interlayer insulating film 27 and the bottom surfaces of the via holes 27a by the thin film forming method that shows the high anisotropy in the vertical direction. The similar conditions to those in the first embodiment are employed in forming the metal film 9. For example, the metal film 9 is formed of the lower metal film 9a made of the Cu diffusion barrier material, and the upper metal film 9b made of the material that can be satisfactorily electrically or mechanically connected to the via described later.

In this case, like the first embodiment, the metal film 9 may be formed of a single layer or plural layers that are made of any one of Ta, TaN, Ti, and TiN, or their combination.

Figure 2E:
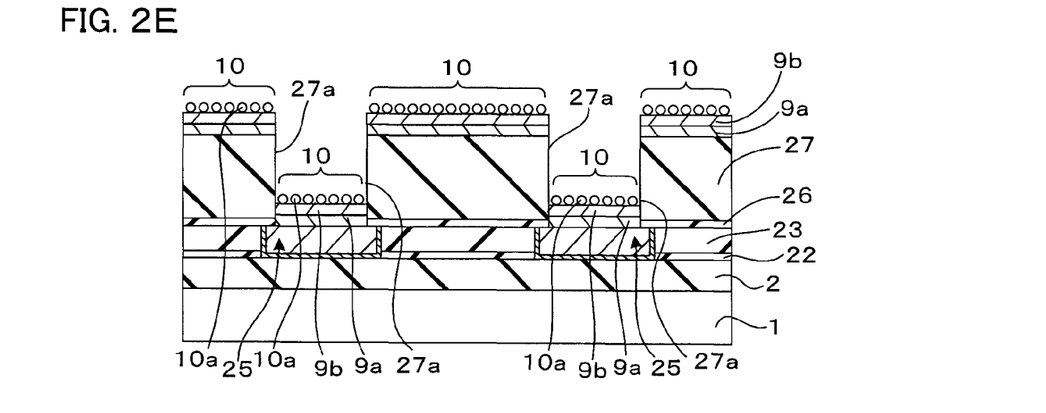

Then, as shown in FIG. 2E, the catalyst surface 10 is formed on the surface of the metal film 9, i.e., on the metal film 9 on the bottom portions of the via holes 27a and the metal film 9 on the third interlayer insulating film 27.

The catalyst surface 10 is formed of the catalyst metal fine particles or the catalyst film, and the catalyst metal fine particles 10a are shown in FIG. 2E. The metal element constituting the catalyst metal fine particles or the catalyst film may be formed of Co, Fe, Ni, or the binary metal containing either of them, for example, TiCo, or alloy containing either of them by the method and conditions similar to those in the first embodiment. In this case, when the catalyst surface 10 is formed of the catalyst film, a thickness of the catalyst film is set to about 1 nm, for example.

Figure 2F:
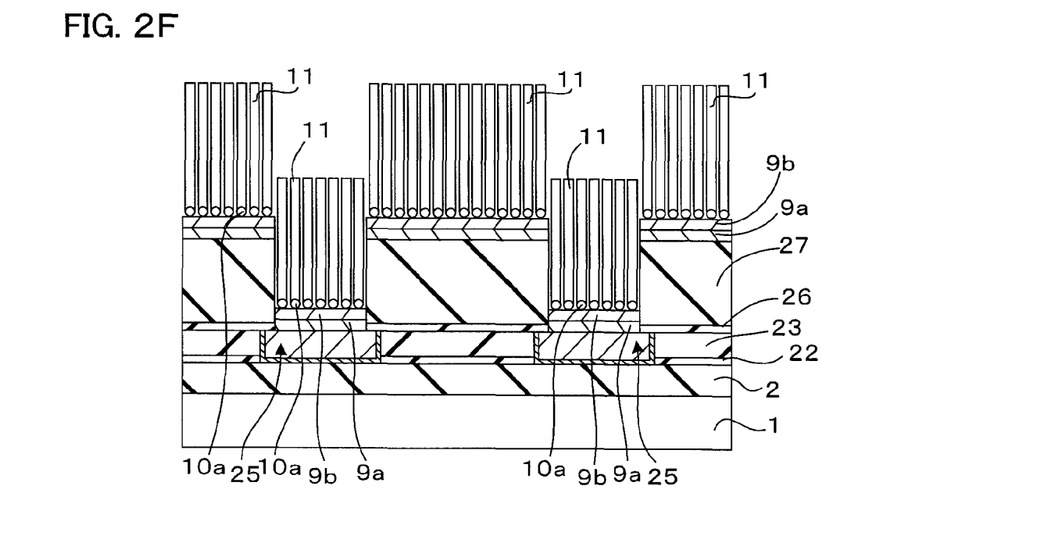

Then, as shown in FIG. 2F, the carbon nanotubes 11 are grown on the whole surface of the catalyst surface 10 by the similar method to that in the first embodiment.

In this case, when the third interlayer insulating film 27 is porous and also the pore sealing layer is formed on the inner surfaces of the via holes 27a, the gas used in growing the carbon nanotubes 11 is blocked by the pore sealing layer and never exerts an influence upon the inside of the third interlayer insulating film 27.

Figure 2G:
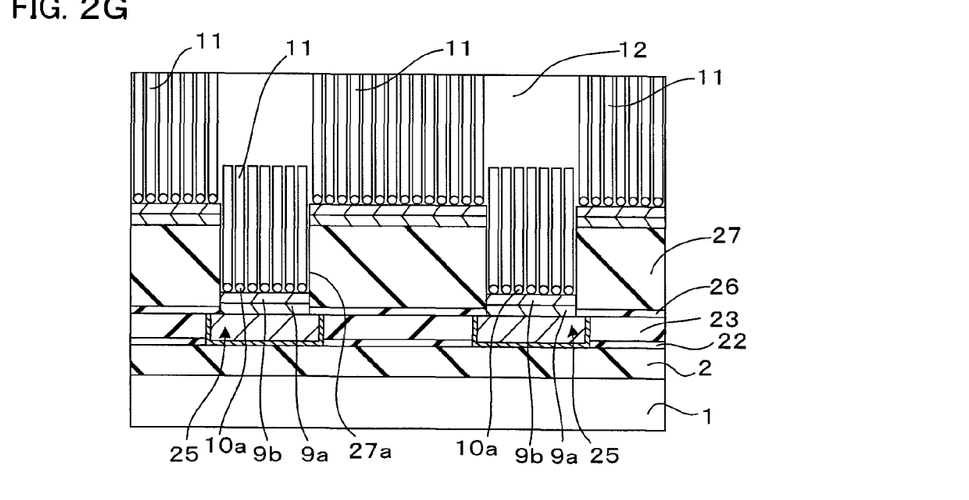

Then, as shown in FIG. 2G, the buried insulating film 12 is formed in the clearances among a plurality of carbon nanotubes 11 that are grown in the via holes 27a and on the third interlayer insulating film 27 respectively.

The buried insulating film 12 is formed by the similar method to that in the first embodiment, and is formed of SOG as the coating insulating substance, for example. It is preferable to form the porous film as the buried insulating film 12, because the porous film includes few defects such as a crack, or the like. Also, it is preferable that the buried insulating film 12 should be formed of the material of a low dielectric constant from an aspect of electrical conductivity.

Figure 2H:
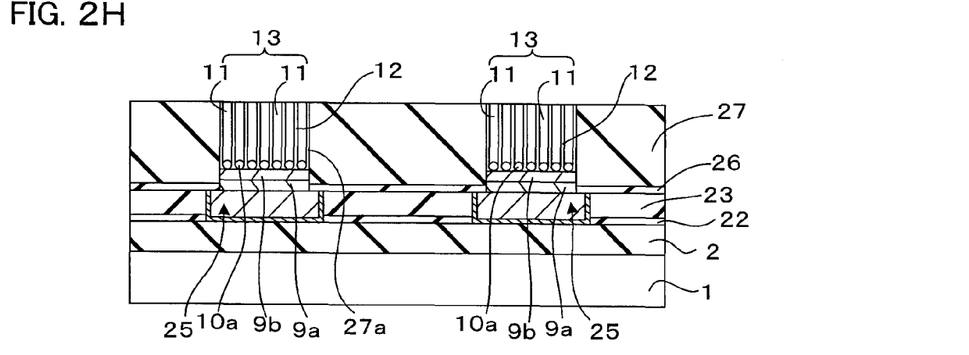

Then, as shown in FIG. 2H, the carbon nanotubes 11 and the buried insulating film 12 are polished by the CMP method. Thus, upper surfaces of the carbon nanotubes 11 and the buried insulating film 12 are planarized, and also the carbon nanotubes 11, the buried insulating film 12, and the metal film 9 are removed from the upper surface of the third interlayer insulating film 27. In polishing the carbon nanotubes 11, the buried insulating film 12, and the metal film 9, the similar conditions to those in the first embodiment are employed.

As a result, the carbon nanotubes 11 are left selectively in the via holes 27a as the via 13.

Then, the polishing residue on the surface of the third interlayer insulating film 27 is removed by a 5% dilute hydrofluoric acid, for example. Also, an exposed level of the bundle of the carbon nanotubes 11, i.e., the upper end of the via 13 from the upper end of the via hole 27a is increased by etching the exposed surface of the buried insulating film 12.

Figure 2I:
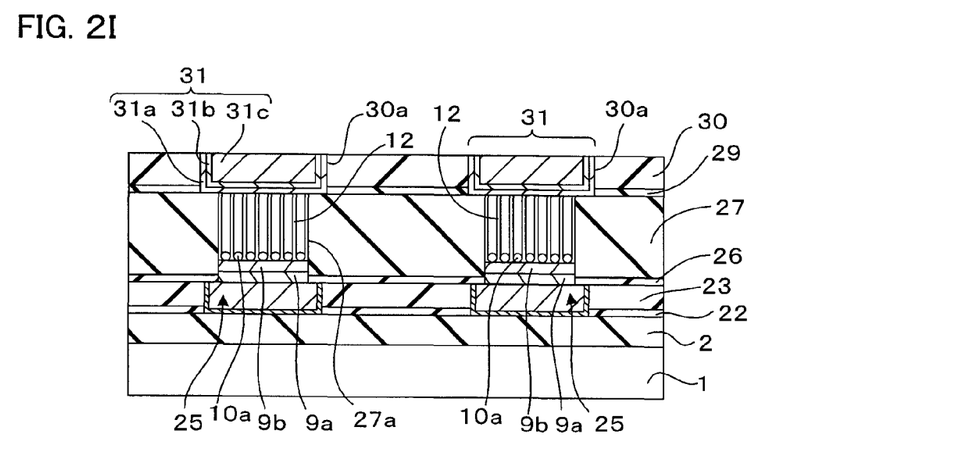

Then, as shown in FIG. 2I, a second-layer wiring 31 of the damascene structure connected to the upper end of the via 13 is formed on the third interlayer insulating film 27. The second-layer wiring 31 is formed by the following method.

First, a second underlaying insulating film 29 made of silicon nitride is formed on the third interlayer insulating film 27 by the CVD method, and then a fourth interlayer insulating film 30 made of the material of a low dielectric constant is grown. As the material of a low dielectric constant, for example, the above material containing silicon, or SiOC, or the like is employed.

Then, wiring recesses 30a whose width is about 200 nm are formed by patterning the fourth interlayer insulating film 30 by means of the photolithography method. When the dry etching is used to form the wiring recesses 30a, a fluorine gas is used. In this case, the second underlaying insulating film 29 acts as an etching stopper layer.

Then, the second underlaying insulating film 29 exposed from the wiring recesses 30a is etched selectively by a phosphoric acid. Thus, the wiring recesses 30a are deepened.

Then, a contact film 31a having a two-layered structure made of TiN and Ti being formed sequentially, and a Cu diffusion preventing film 31b made of Ta are formed sequentially on inner surfaces of the wiring recesses 30a.

Then, a Cu film 31c is formed on the Cu diffusion preventing film 31b by the electroplating to fill the wiring recesses 30a. Then, an electrical connection between the vias 13 and the contact film 31a is improved by the annealing at 400° C.

Then, the contact film 31a, the Cu diffusion preventing film 31b, and the Cu film 31c formed on the upper surface of the third interlayer insulating film 27 are removed by the CMP method. As a result, the Cu film 31c, the Cu diffusion preventing film 31b, and the contact film 31a left in the wiring recesses 30a are used as the second-layer wiring 31 of the damascene structure.

Then, although not particularly shown in figure, a silicon nitride film, an interlayer insulating film, a wiring, etc. are formed further.

With the above, a multi-layered interconnection structure for connecting the first-layer wiring 25 and the second-layer wiring 31 via the vias 13 made of the carbon nanotubes 11 in the electronic device is formed.

As described above, in the present embodiment, the catalyst surface 10 is positively formed not only in the via holes 27a but also on the surface of the third interlayer insulating film 27, and then the carbon nanotubes 11 are grown thereon. Therefore, like the first embodiment, the conditions for forming the catalyst surface 10 are relaxed, and as a result a yield of the vias 13 is enhanced rather than the prior art.

Also, the clearances in the bundle of the carbon nanotubes 11 are buried with the buried insulating film 12. Therefore, the carbon nanotubes 11 are fixed and thus removal by the polishing is made easy. In addition, the clearances among the carbon nanotubes 11 constituting the via 13 are filled with the buried insulating film 12. Therefore, the buried insulating film 12 prevents the foreign matter from deteriorating the carbon nanotubes 11 in the via holes 27a.

Further, when the third interlayer insulating film 27 in which the via holes 27a are formed on the copper layer 25 is formed of the porous material having a low dielectric constant, the pore sealing layer 24 is formed on the surface of the third interlayer insulating film 27. Therefore, the pore sealing layer 24 prevents gas used in growing the carbon nanotubes 11 from exerting a harmful influence on the third interlayer insulating film 27.

Third Embodiment

FIGS. 3A to 3F are sectional views showing an electronic device according to a third embodiment of the present invention and steps of manufacturing the same. Here, in FIGS. 3A to 3F, the same reference symbols as those in FIGS. 2A to 2I denote the same elements respectively.

First, according to the steps similar to those shown in FIGS. 2A and 2B in the second embodiment, the first interlayer insulating film 2, the first underlaying insulating film 22, the second interlayer insulating film 23, the first-layer wirings 25, the first silicon nitride film 26, and the third interlayer insulating film 27 are formed on the silicon substrate 1. The third interlayer insulating film 27 is formed of the material having a low dielectric constant.

Figure 3A:
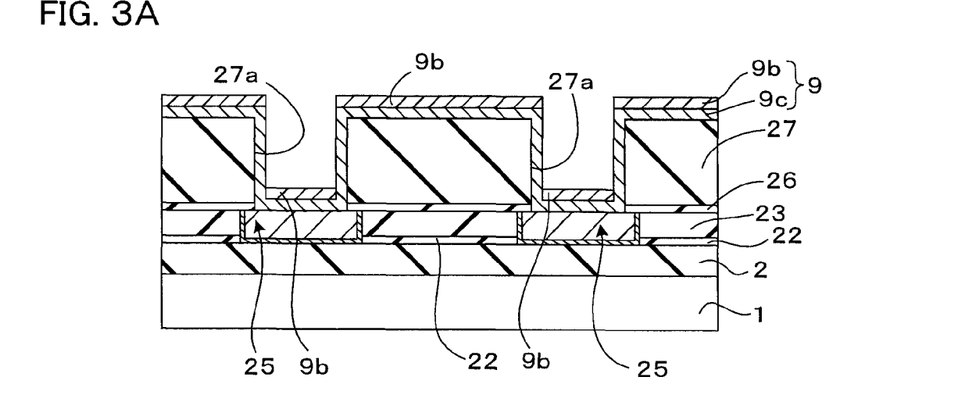
FIGS. 3A to 3F are sectional views showing an electronic device according to a third embodiment of the present invention and steps of manufacturing the same.

Then, the via holes 27a are formed in the third interlayer insulating film 27 on the first-layer wirings 25. Then, the pore sealing layer (not shown) is formed on the upper surface of the third interlayer insulating film 27 and inner wall surfaces and bottom surfaces of the via holes 27a. Then, the first silicon nitride film 26 and the pore sealing layer formed thereon are etched through the via holes 27a to expose a part of the first-layer wirings 25.

Then, as shown in FIG. 3A, a lower metal film 9c and the upper metal film 9b constituting the metal film 9 are formed sequentially on the upper surface of the third interlayer insulating film 27 and the inner wall surfaces and the bottom surfaces of the via holes 27a.

As the lower metal film 9c of the metal film 9, a metal diffusion barrier film is formed by the sputtering method whose anisotropy is small. The lower metal film 9c is formed of any one of Ta, TaN, Ti, and TiN or their combination, for example. Out of them, Ta and TaN have the excellent barrier property to the copper, and the like.

Also, like the first embodiment, as the upper metal film 9b, the contact film is formed by the highly anisotropic film forming method such as the anisotropic long-throw sputtering method, or the like. The upper metal film 9b is formed on the upper surface of the third interlayer insulating film 27 and the bottom surfaces of the via holes 27a, but is not substantially formed on the side wall surfaces of the via holes 27a.

The upper metal film 9b is formed of any one of Ta, TaN, Ti, and TiN or their combination, for example. In particular, Ti and TiN can achieve the good electrical and mechanical contact to the carbon nanotube 11 described later.

Figure 3B:
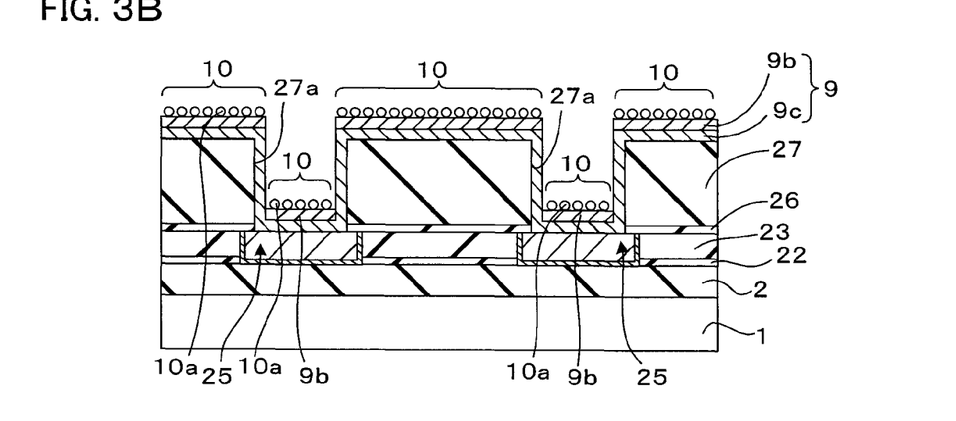

Then, as shown in FIG. 3B, the catalyst surface 10 is formed on the upper metal film 9b that is formed on the bottom surfaces of the via holes 27a and the upper surface of the third interlayer insulating film 27 respectively.

The catalyst surfaces 10 are formed of the catalyst metal fine particles or the catalyst film, and the catalyst metal fine particles 10a are shown in FIG. 3B. As the metal element constituting the catalyst metal fine particles or the catalyst film, Co, Fe, Ni, or a binary metal containing either of them, for example, TiCo, or alloy containing either of them is formed by the method and conditions similar to the first embodiment.

Figure 3C:
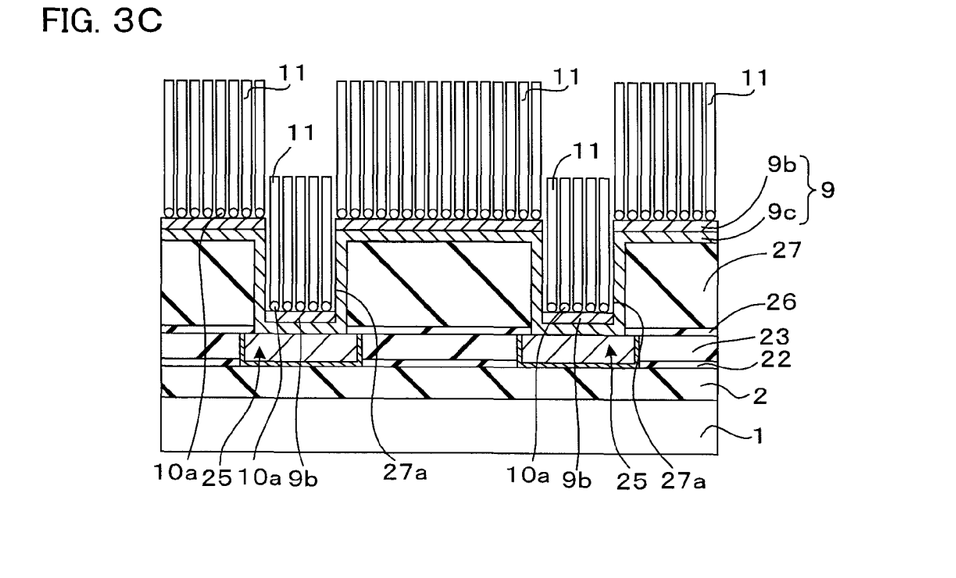

Then, as shown in FIG. 3C, the carbon nanotubes 11 are grown on the whole surfaces of the catalyst surfaces 10 by the similar method to that in the first embodiment.

The lower metal film 9c formed of the Cu diffusion barrier material formed in the inner surfaces of the via holes 27a blocks such a situation that the gas used in growing the carbon nanotubes 11 exerts a bad influence upon the third interlayer insulating film 27.

Figure 3D:
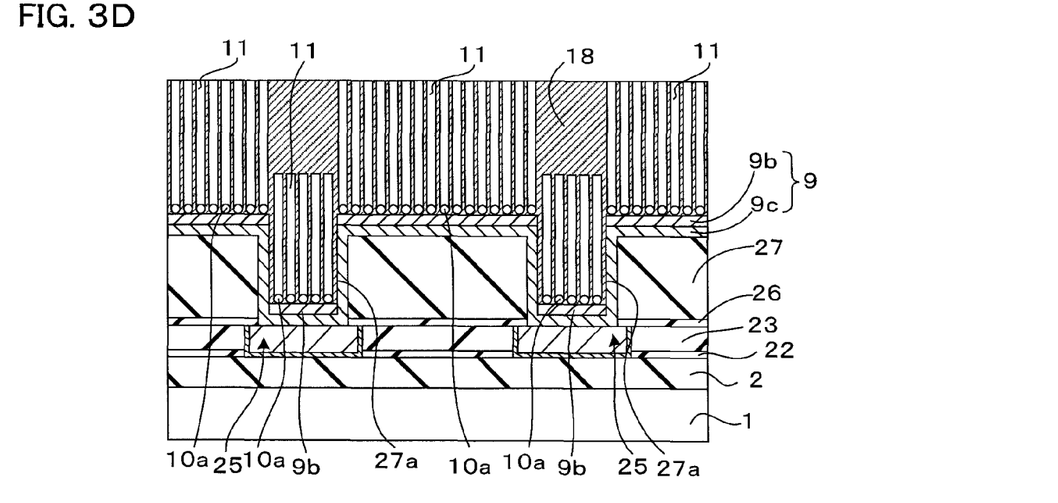

Then, as shown in FIG. 3D, a buried metal film 18 is formed in the clearances in the bundle of a plurality of carbon nanotubes 11 in the via holes 27a and on the third interlayer insulating film 27 respectively.

The buried metal film 18 is made of Cu, for example, and is formed by the electroplating or the electroless plating. In this case, any metal other than Cu, which can contact the carbon nanotubes 11 at low resistance, e.g., Ti, palladium (Pd), or the like or other conductive materials can be employed as the buried metal film 18.

The buried metal film 18, which is made of Cu and filled in the via holes 27a, is suppressed from diffusing into the third interlayer insulating film 27 by the Cu diffusion barrier film 9c.

Figure 3E:
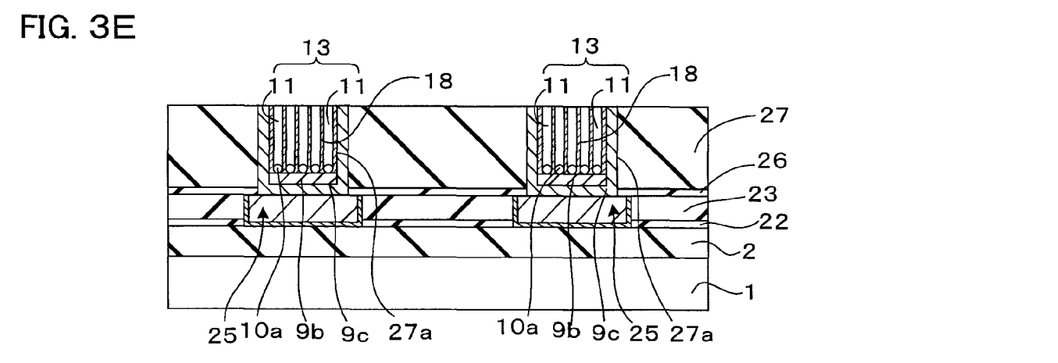

Then, as shown in FIG. 3E, the carbon nanotubes 11 and the buried metal film 18 are polished by the CMP method. Thus, upper surfaces of the carbon nanotubes 11 and the buried metal film 18 are planarized, and also the carbon nanotubes 11, the buried metal film 18, and the metal film 9 are removed from the upper surface of the third interlayer insulating film 27.

As a result, the carbon nanotubes 11 and the buried metal film 18 are left selectively in the via holes 27a as the via 13.

The preferable polishing condition used in the CMP method is the highly selective polishing condition in which a polishing rate of the copper constituting the buried metal film 18 is larger than a polishing rate of the Ta constituting the metal film 9 in initial stage of the CMP.

A polishing rate of the carbon nanotubes 11 is decreased correspondingly as the quality is improved highly. In such case, a polishing rate of the carbon nanotubes 11 can be increased by selecting the slurry that can increase a mechanical polishing component. In this case, since it is feared that damage of the buried metal film 18 is increased, an extent of increase in the mechanical polishing component must be adjusted.

The slurry is changed to the acid slurry for Ta at a point of time when lower metal film 9a is exposed with the progress of the polishing of the carbon nanotubes 11 and the buried metal film 18. In this case, it is desired that a polishing rate of the metal film 9 is set larger than a polishing rate of the third interlayer insulating film 27.

Accordingly, the polishing of the third interlayer insulating film 27 is suppressed while the lower metal film 9a of the metal film 9 is being polished. Thus, the metal film 9 is selectively removed.

After the metal film 9 is removed, a polishing residue on the surface of the third interlayer insulating film 27 is removed by a 5% dilute hydrofluoric acid, for example.

Figure 3F:
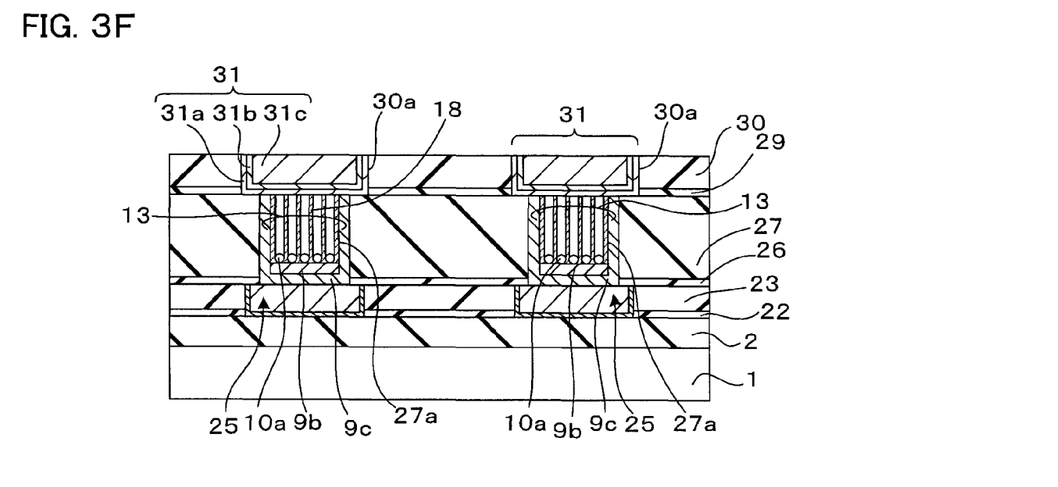

Then, as shown in FIG. 3F, the second-layer wirings 31 of the damascene structure connected to the upper ends of the vias 13 are formed on the third interlayer insulating film 27 by the method similar to that in the second embodiment.

With the above, the multi-layered interconnection structure for connecting the first-layer wiring 25 and the second-layer wiring 31 via the vias 13 made of the carbon nanotubes 11 in the electronic device is formed.

As described above, in the present embodiment, the catalyst surface 10 is positively formed not only on the bottom portions of the via holes 27a but also on the surface of the third interlayer insulating film 27, and then the carbon nanotubes 11 are grown thereon. Therefore, like the first embodiment, the conditions for forming the catalyst surface 10 and the carbon nanotubes 11 are relaxed and, as a result, a yield of the vias 13 is enhanced in contrast to the prior art.

Also, the clearances among a large number of carbon nanotubes 11 are buried with the buried metal film 18. Therefore, the carbon nanotubes 11 are fixed and thus removal by the polishing is facilitated. In addition, the clearances among the carbon nanotubes 11 constituting the via 13 are buried with the buried metal film 18. Therefore, the degradation of the carbon nanotubes 11 caused due to entering of the foreign matter into the via holes 27a is prevented.

Further, since the buried metal film 18 is filled in the clearances among the carbon nanotubes 11 in the via holes 27a, a reduction of resistance of the via 13 can be attained without any change of size. In this case, a current density of the current flowing through the via is increased rather than the case where the vias are formed of the copper in the same size.

In the first to third embodiments, the semiconductor device is explained by way of example. The multi-layered interconnection structure in other electronic devices is formed by the above method to have the same structure as the above structure.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

Other systems, methods, features and advantages of the invention will be or will become apparent to one with skill in the art upon examination of the figures and detailed description. It is intended that all such additional systems, methods, features and advantages be included within this description, be within the scope of the invention, and be protected by the accompanying claims.

What is claimed is:

1. A method of manufacturing an electronic device, comprising:
    forming a conductive pattern over a first insulating film, the first insulating film being formed over a substrate;
    forming a second insulating film to cover the first insulating film and the conductive pattern;
    forming a hole in the second insulating film over the conductive pattern;
    forming a supporting film for supporting a catalyst over a bottom surface of the hole and an upper surface of the second insulating film;
    forming a catalyst element on an upper surface of the supporting film, the catalyst element being made of at least one of catalyst particles and a catalyst film;
    growing carbon element cylindrical structures on the catalyst element;
    forming a buried insulating film in a clearance among the carbon element cylindrical structures and over the second insulating film, and in the hole; and
    polishing the carbon element cylindrical structures, the buried insulating film, and the supporting film to remove the carbon element cylindrical structures, the buried insulating film, and the supporting film over an upper surface of the second insulating film and to leave the buried insulating film and the carbon element cylindrical structures in the hole as a via.

2. The method of claim 1, wherein the supporting film is formed of any one of tantalum, tantalum nitride, titanium, and titanium nitride, and their combination.

3. The method of claim 1, wherein the supporting film is formed by a sputter method to grow selectively in a direction perpendicular on the substrate.

4. The method of claim 1, wherein the catalyst particles or the catalyst film is formed of any one of a first metal made of one of cobalt, iron, and nickel, a binary metal containing the first metal, and an alloy of the first metal.

5. The method of claim 1, wherein the buried insulating film is formed by coating a coating insulating material and then curing the coating insulating material by an annealing.

6. The method of claim 5, wherein before coating the coating insulating material in the clearance among the carbon element cylindrical structures and in the hole, applying any one of oxygen plasma, ozone, and ultraviolet ray to a coating area of the coating insulating material.

7. The method of claim 5, wherein a polishing condition for leaving the buried insulating film and the carbon element cylindrical structures in the hole is changed to set a polishing rate of the supporting film larger than a polishing rate of the buried insulating film and the second insulating film, when the supporting film is exposed by polishing the buried insulating film and the carbon element cylindrical structures.

8. The method of claim 5, wherein after polishing the buried insulating film and the carbon element cylindrical structures, increasing an exposed portion of the carbon element cylindrical structures by etching an exposed surface of the buried insulating film in the hole.

9. The method of claim 1, further comprising the step of:
    forming an upper conductive pattern, which is connected to an upper end of the via in the hole, over the second insulating film.

* * * * *